(12) United States Patent
Wang et al.

(10) Patent No.: US 7,153,725 B2
(45) Date of Patent: Dec. 26, 2006

(54) STRIP-FABRICATED FLIP CHIP IN PACKAGE AND FLIP CHIP IN SYSTEM HEAT SPREADER ASSEMBLIES AND FABRICATION METHODS THEREFOR

(75) Inventors: Tie Wang, Singapore (SG); Virgil Cotoco Ararao, Singapore (SG); Il Kwon Shim, Singapore (SG); Sheila Marie L. Alvarez, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 132 days.

(21) Appl. No.: 10/766,746

(22) Filed: Jan. 27, 2004

(65) Prior Publication Data
US 2005/0161780 A1    Jul. 28, 2005

(51) Int. Cl.
*H01L 23/31* (2006.01)
(52) U.S. Cl. ............... 438/122; 257/796; 257/E23.133
(58) Field of Classification Search ............... 257/706, 257/707, 712, 796, E23.129, E23.133, E21.502; 438/111, 112, 122
See application file for complete search history.

(56) References Cited

U.S. PATENT DOCUMENTS

| | | | |
|---|---|---|---|
| 5,450,283 A * | 9/1995 | Lin et al. ................... | 361/704 |
| 5,726,079 A | 3/1998 | Johnson | |
| 5,949,137 A | 9/1999 | Domadia et al. | |
| 6,309,915 B1 * | 10/2001 | Distefano ................... | 438/127 |
| 6,410,988 B1 | 6/2002 | Caletka et al. | |
| 6,444,498 B1 | 9/2002 | Huang et al. | |
| 6,534,858 B1 * | 3/2003 | Akram et al. ............... | 257/706 |
| 6,559,537 B1 * | 5/2003 | Bolken et al. ............. | 257/712 |
| 6,734,552 B1 * | 5/2004 | Combs et al. ............. | 257/707 |
| 6,830,956 B1 * | 12/2004 | Masumoto et al. ......... | 438/108 |
| 6,853,070 B1 * | 2/2005 | Khan et al. ................. | 257/707 |
| 6,933,176 B1 * | 8/2005 | Kirloskar et al. ........... | 438/122 |
| 2001/0019181 A1 * | 9/2001 | Lee et al. ................... | 257/796 |
| 2002/0149092 A1 * | 10/2002 | Lee ........................... | 257/668 |
| 2004/0212056 A1 * | 10/2004 | Chen et al. ................. | 257/678 |

* cited by examiner

*Primary Examiner*—Carl Whitehead, Jr.
*Assistant Examiner*—Jennifer M Dolan
(74) *Attorney, Agent, or Firm*—Mikio Ishimaru

(57) ABSTRACT

A method for fabricating a semiconductor package with a substrate in a strip format is provided. Semiconductor devices are attached in a strip format to the substrate, and a thermal interface material is applied to the semiconductor devices. A flat panel heat spreader is attached to each semiconductor device. The semiconductor devices are encapsulated with open encapsulation, leaving the surface of the flat panel heat spreader opposite the substrate externally exposed. Individual semiconductor packages are then singulated from the strip format.

20 Claims, 9 Drawing Sheets

STRIP-FABRICATED FLIP CHIP IN PACKAGE AND FLIP CHIP IN SYSTEM HEAT SPREADER ASSEMBLIES AND FABRICATION METHODS THEREFOR

TECHNICAL FIELD

The present invention relates generally to encapsulated semiconductor device packages, and more particularly to flip chip in package and flip chip in system heat spreader assemblies that are fabricated in strip format, and to methods for the fabrication thereof.

BACKGROUND ART

The general construction of encapsulated semiconductor devices, for example ball grid array ("BGA") packages, consists of a semiconductor chip mounted on an upper surface of a laminate substrate, both encased in a plastic resin encapsulant, and with a number of solder balls attached to the lower surface of the laminate substrate. The solder balls facilitate bonding the semiconductor package to a circuit card or board.

Traditionally, one of the most common BGA packages is a semiconductor chip that is electrically connected to electrical circuitry on a laminate substrate by conventional wire bonds or loop wire bonds. The semiconductor device has an over-molded plastic resin body that protects the semiconductor chip and the wire bonds, and this over-molded body may be up to 20 mils thick above the chip surface to adequately protect the wire loops. Consequently, the wire-bonded BGA has a relatively high thermal resistance for removing heat. As a result, the low heat dissipation capability makes the wire-bonded package unsuitable for high power applications.

Flip chip BGA's are a newer and thinner design that has better heat dissipation. Flip chip packages are semiconductor chips that have electrical connections in the form of solder bump contacts on the surface of the chip that faces (is adjacent to) the laminate substrate. Flip chip packages derive their name from the apparent flipping of the chip (with contacts down) so that the chip is upside down compared to that of the chip (with contacts up) in wire-bonded BGA's. Since the solder bumps are connected directly to the circuitry of the laminate substrate, there is no need for large wire loops or the thick molded plastic resin body that surrounds them.

A flip chip package typically requires an underfill material to keep moisture away from solder interconnections and to reinforce the solder joints that can be prone to fatigue. The underfill material surrounds the solder interconnections between the chip and the laminate substrate.

Flip chip packages have also been made with a thermally conductive covering, usually metal, to further improve heat transfer. The thermally conductive covering is attached to the chip with a thermal coupler or thermal interface material ("TIM"), such as an adhesive, a thermal paste, or a grease, to improve the transfer of heat from the chip to the thermally conductive covering. A flip chip package of this construction can have an additional problem since attachment of the thermally-conductive covering may result in delamination at the chip-to-covering interface. If the TIM is fairly rigid, the thermal coupler can fracture the chip. If the TIM is non-rigid, for example a thermal grease, it may displace during thermal cycling.

The current trend in high-end semiconductor device designs is to shrink the form factor (the dimensions and arrangement of the device) and to increase the integration level (the number of electronic circuits in the device). This means that the individual circuit components within an integrated circuit continually get smaller and smaller, while the integrated circuits themselves contain more and more circuits and circuit components. This leads to an increase in power density, and consequently worsens thermal management concerns.

Thermal management must therefore be addressed, both with regard to the design of the integrated circuit itself, and with regard to efficient thermal management at the packaging and at the system levels. Flip chip in package ("FCIP") and flip chip-system in package ("FC-SiP") configurations are widely used in such situations since they can be effectively tailored to provide significant thermal management. Unfortunately, the more successful prior FCIP and FC-SiP thermal management package designs have appeared in configurations that are manufactured in less-efficient singulated (rather than strip format) processes.

For reduced manufacturing costs, FCIP and FC-SiP configurations that are assembled in strip format are more favorable in many package size ranges. Unfortunately, current strip-format fabrication methods are unduly complicated and cumbersome, which defeats the potential efficiency and cost savings of strip-format manufacturing.

Thus, a need still remains for lower cost and less complicated semiconductor chip package designs and assembly processes, and particularly for package designs and assembly processes that are structured for efficient assembly in strip format. In view of the continuing increase in semiconductor device component and power densities, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a semiconductor package with a substrate in a strip format. Semiconductor devices are attached in a strip format to the substrate, and a thermal interface material is applied to the semiconductor devices. A flat panel heat spreader is attached to each semiconductor device. The semiconductor devices are encapsulated with open encapsulation, leaving the surface of the flat panel heat spreader opposite the substrate externally exposed. Individual semiconductor packages are then singulated from the strip format.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
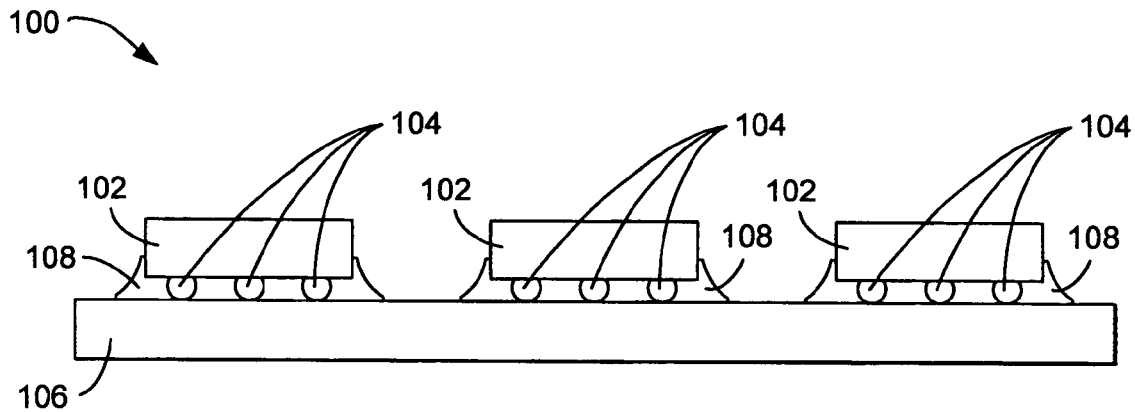
FIG. 1 is a view of a portion of a flip chip assembly at an intermediate stage of manufacture in accordance with the present invention.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Likewise, the drawings showing embodiments of the devices and the process steps for the fabrication thereof are semi-diagrammatic and not to scale and, particularly, some of the dimensions are for the clarity of presentation and are shown exaggerated in the drawing FIGS. In addition, where multiple embodiments that are disclosed and described have some features in common, for clarity and ease of illustration, description, and comprehension thereof, like features one to another will ordinarily be described with like reference numerals.

The term "horizontal" as used herein is defined as a plane parallel to the conventional plane or surface of the semiconductor device or die, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

This invention relates generally to flip chip in package ("FCIP") and flip chip-system in package ("FC-SiP") assemblies that are fabricated in strip format, and to methods for manufacturing these assemblies. More particularly, the invention relates to making strip-fabricated flip chip packages that have a flat panel heat spreader attached externally over the entire strip. This results in lower manufacturing costs due to the straightforward heat spreader design and to the less complicated assembly process for the manufacture thereof. In addition, the flat panel heat spreaders afford maximum space underneath the heat spreaders, to accommodate a variety of components in FC-SiP assemblies, while also affording maximum contact area for next level heat dissipation. The configurations also fill encapsulant into the entire void space below the heat spreader to enhance stiffness and minimize warpage of the assembly.

Referring now to FIG. 1, therein is shown a portion of a flip chip assembly 100 at an intermediate stage of manufacture. The portion of the flip chip assembly 100 shown in FIG. 1 is part of a continuous-strip flip chip configuration that is manufactured and assembled in a continuous assembling, forming, molding, curing, and singulating process as generally known in the art. As taught herein, however, the continuous-strip manufacturing process is uniquely configured to provide packages having flat panel heat spreaders externally exposed over substantially an entire surface or face of each package, in a new, uncomplicated, and economical process.

Thus, semiconductor flip chip devices such as chips 102, having solder balls 104, are secured and electrically connected to the top surface of a substrate 106 on solder pads (not shown) on the top surface of the substrate 106. The substrate 106 is provided and configured in a continuous strip format, and the chips 102 are attached in a continuous strip format to the substrate 106. An underfill 108 is applied between and fills the space between the chips 102 and the substrate 106.

In an assembly process wherein FCIPs are being manufactured, exemplary chips such as the chips 102 will be assembled in this manner onto the substrate 106. It will also be understood that other electronic components may also be assembled onto the substrate 106, such as when packages in system such as FC-SiPs are being fabricated according to the present invention. Accordingly, the chips 102, as shown and described, are illustrative and exemplary and also represent such other components and/or systems as appropriate.

Figure 2:
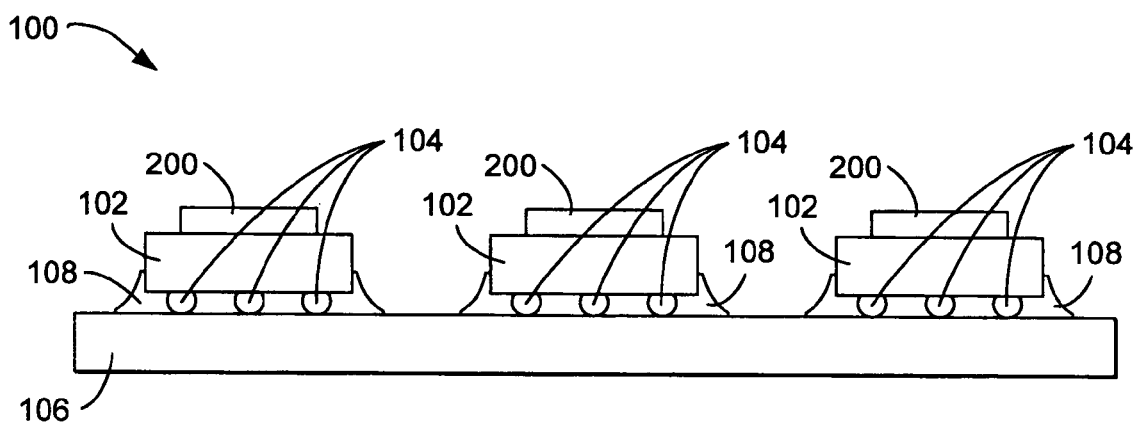
FIG. 2 is the structure of FIG. 1 after application of a thermal interface material.

Referring now to FIG. 2, therein is shown the configuration of FIG. 1 following application of a thermal interface material ("TIM") 200 to the upper faces of the chips 102 opposite the substrate 106.

Figure 3:
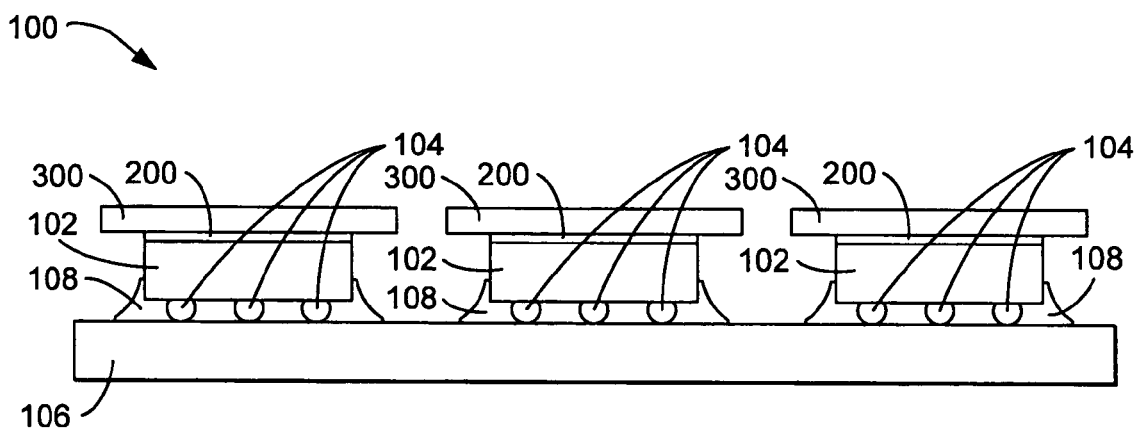
FIG. 3 is the structure of FIG. 2 after attachment of flat panel heat spreaders to the thermal interface material.

Referring now to FIG. 3, therein is shown the next stage following FIG. 2 in the continuous-strip manufacturing of the flip chip assembly 100. Thus, FIG. 3 shows the FIG. 2 configuration with the addition of heat spreaders 300 that are pre-cut flat panels placed individually onto the TIM 200 on top of each of the chips 102. The heat spreaders 300, preferably of a suitable metallic material, are then attached to and held on the chips 102 by the TIM 200, which is cured, for example, by thermal curing.

Figure 4:
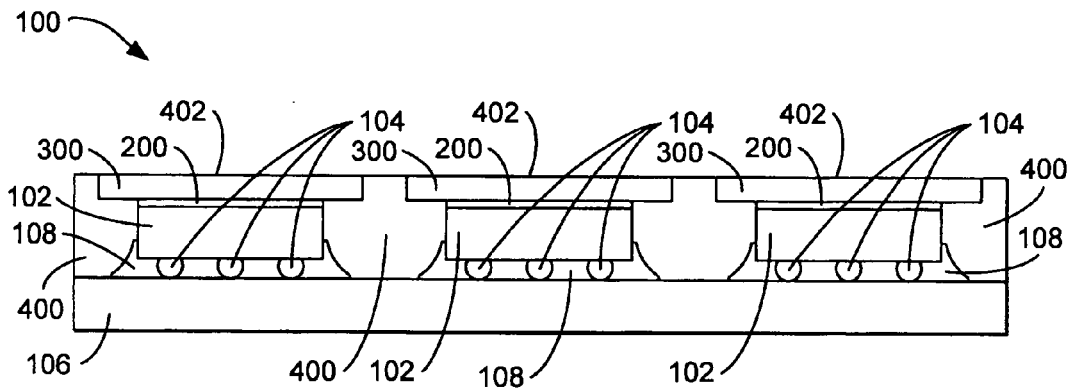
FIG. 4 is a cross-sectional view of the structure of FIG. 3 after application and molding of an encapsulant.

Referring now to FIG. 4, therein is shown a cross-sectional view of the structure of FIG. 3 following application and molding of an encapsulant 400 to encapsulate all of the volume around the chips 102 and up to the level of the top surfaces 402 of the heat spreaders 300. As can be seen, encapsulating the semiconductor chip devices in this manner leaves the top surfaces 402 of the flat panel heat spreaders, opposite the substrate 106, externally exposed.

As can also be seen, the positioning of the heat spreaders 300 above the chips 102 in this manner provides maximum space and volume underneath the heat spreaders 300. This advantageously accommodates a wide variety and number of chip and/or system component configurations. It will also be appreciated that the encapsulant 400, by filling the entire space below the heat spreaders 300 and above the substrate 106, significantly stiffens the assembly to minimize warpage thereof.

Figure 5:
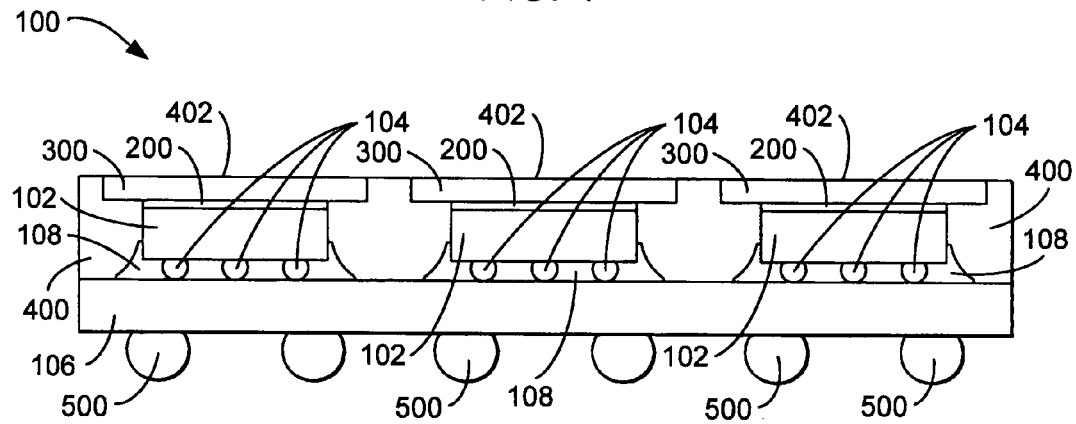
FIG. 5 is the structure of FIG. 4 after attachment of a ball grid array to the underside of the substrate.

Referring now to FIG. 5, therein is shown the structure of FIG. 4 following the optional attachment of a ball grid array ("BGA") 500 to the bottom or underside of the substrate 106 opposite the chips 102. The BGA 500 provides, in conventional manner, for subsequent physical and electrical connection and assembly of the finished package onto a circuit card, a circuit board, or the like. The BGA 500 is connected electrically in known fashion through the substrate 106 by traces (not shown) that connect, as appropriate for the configuration at hand, to various circuit patterns on the substrate 106 and thence to the solder balls 104 on the chips 102.

Figure 6:
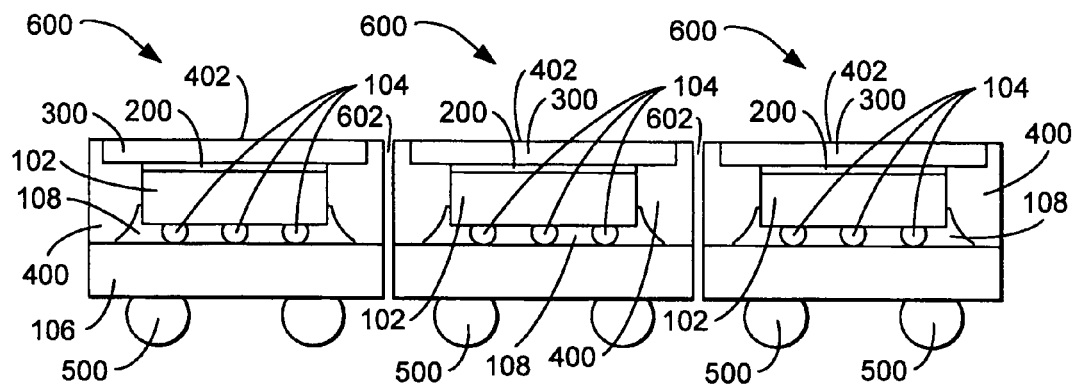
FIG. 6 is the structure of FIG. 5 after singulation of individual units in accordance with the continuous strip-manufacturing process of the present invention.

Referring now to FIG. 6, therein is shown the structure of FIG. 5 following conventional singulation, such as by sawing. The singulation results in the separation of individual semiconductor packages from the continuous strip format of the flip chip assembly 100 (FIG. 5). This produces individual FCIP and/or FC-SiP units 600 at singulation zones 602.

Figure 7:
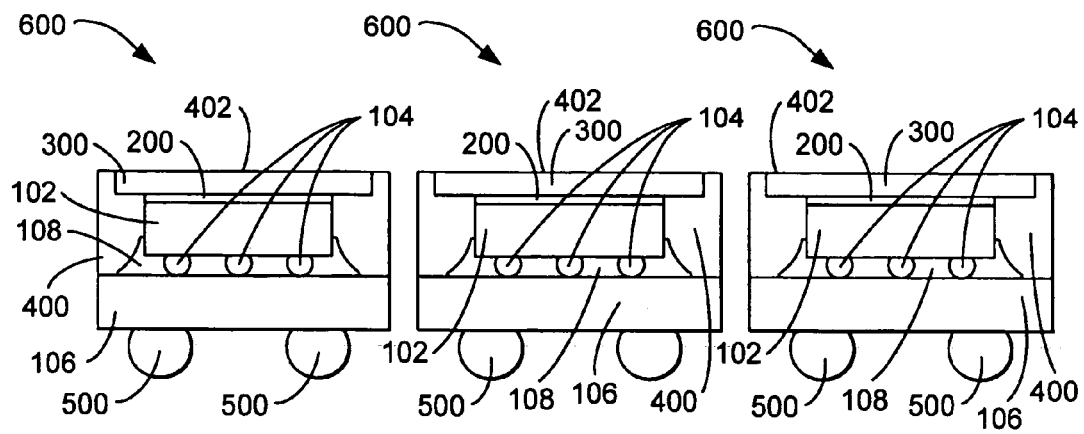
FIG. 7 is a cross-sectional view of three of the units of FIG. 6 in a final product configuration.

Referring now to FIG. 7, therein is shown a cross-sectional view of three of the units 600 in their final product configuration.

Figures 8, 9, 10:
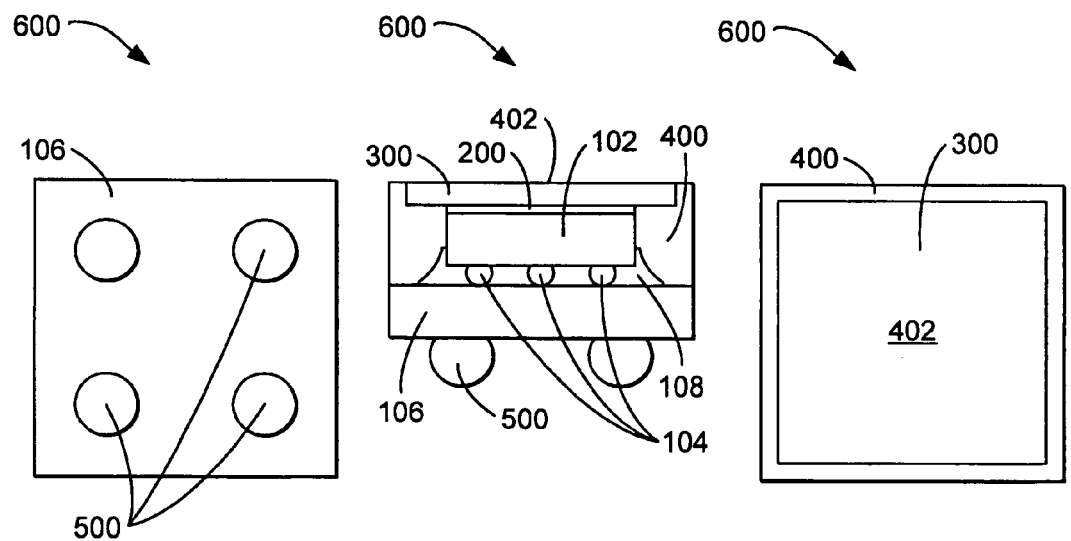
FIG. 8 is a bottom view of one of the units of FIG. 7.
FIG. 9 is a cross-sectional view of one of the units of FIG. 7.
FIG. 10 is a top view of one of the units of FIG. 7.

Referring now to FIG. 8, therein is shown a bottom view of one of the units 600.

Referring now to FIG. 9, therein is shown a cross-sectional view of one of the units 600.

Referring now to FIG. 10, therein is shown a top view of one of the units 600.

Figure 11:
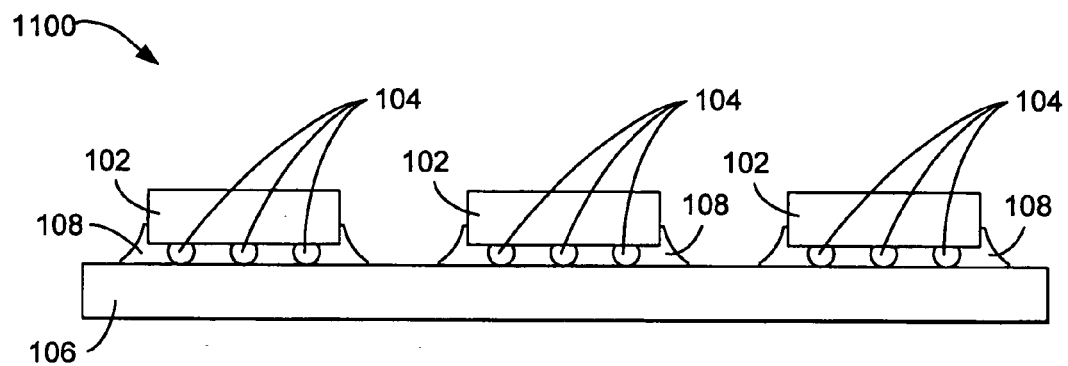
FIG. 11 is a view of an alternate embodiment of a portion of a flip chip assembly in an intermediate stage of manufacture.

Referring now to FIG. 11, therein is shown a portion of an alternate embodiment of a flip chip assembly 1100 at an intermediate stage of manufacture. The portion of the flip chip assembly 1100 shown in FIG. 11 is similarly part of a continuous strip format that is manufactured and assembled in a new, continuous, assembling, forming, molding, curing, and singulating process that provides packages having flat panel heat spreaders externally exposed over substantially an entire surface of each package.

Thus, semiconductor flip chip devices such as the chips 102, having solder balls 104, are secured and electrically connected to the top surface of a substrate 106 on solder pads (not shown) on the top surface of the substrate 106. The substrate 106 is provided and configured in a continuous strip format, and the chips 102 are attached in a continuous strip format to the substrate 106. An underfill 108 is applied between and fills the space between the chips 102 and the substrate 106.

As before, it will also be understood that other electronic components may also be assembled onto the substrate 106, such as when packages in system such as FC-SiPs are being fabricated. Accordingly, the chips 102, as shown and described, are illustrative and exemplary and also represent such other components and/or systems as appropriate.

Figure 12:
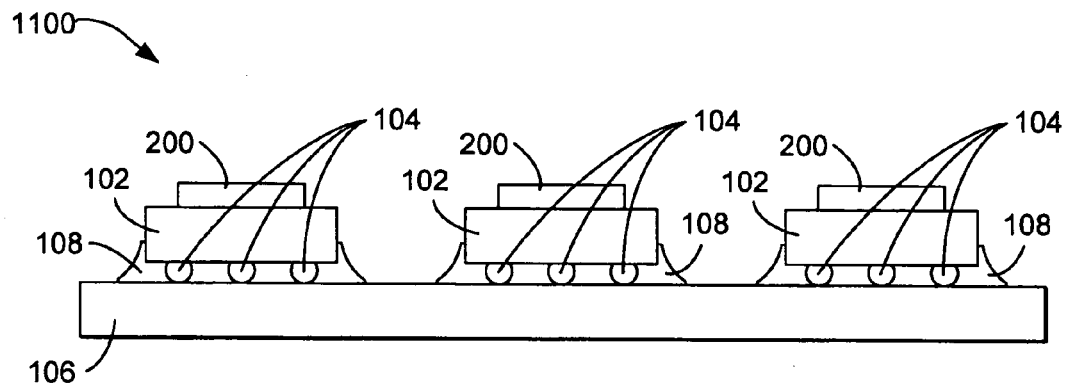
FIG. 12 is the structure of FIG. 11 after application of a thermal interface material.

Referring now to FIG. 12, therein is shown the configuration of FIG. 1 following application of the TIM 200 to the upper faces of the chips 102 opposite the substrate 106.

Figure 13:
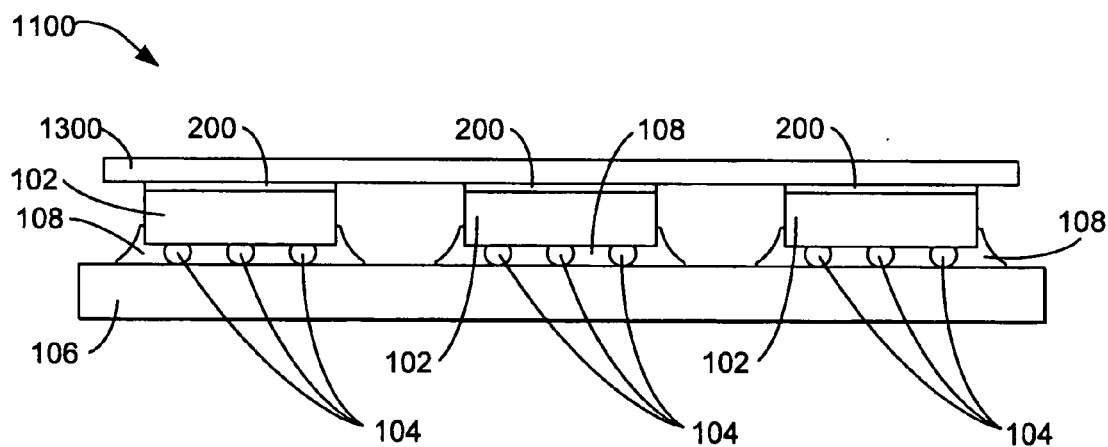
FIG. 13 is the structure of FIG. 12 after attaching a flat panel heat spreader to the thermal interface material.

Referring now to FIG. 13, therein is shown the next stage following FIG. 12 in the continuous-strip manufacturing of the flip chip assembly 1100. Thus, FIG. 13 shows the FIG. 12 configuration with the addition of a heat spreader strip 1300 in the form of a continuous flat metallic strip panel. The heat spreader strip 1300 is attached to and held on the chips 102 by the TIM 200, which is then cured to secure the heat spreader strip 1300 thereon.

Figure 14:
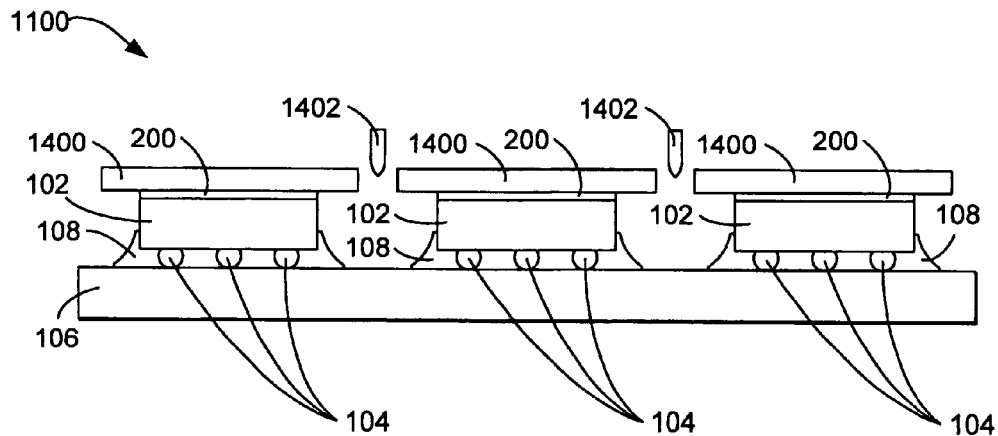
FIG. 14 is the structure of FIG. 13 after separation of the flat panel heat spreader into individual heat spreaders.

Referring now to FIG. 14, therein is shown the configuration of FIG. 13 in which the heat spreader strip 1300 (FIG. 13) is separated into individual heat spreader panels 1400. The separation may be accomplished, for example, by a sawing cut such as by saw blades 1402.

Figure 15:
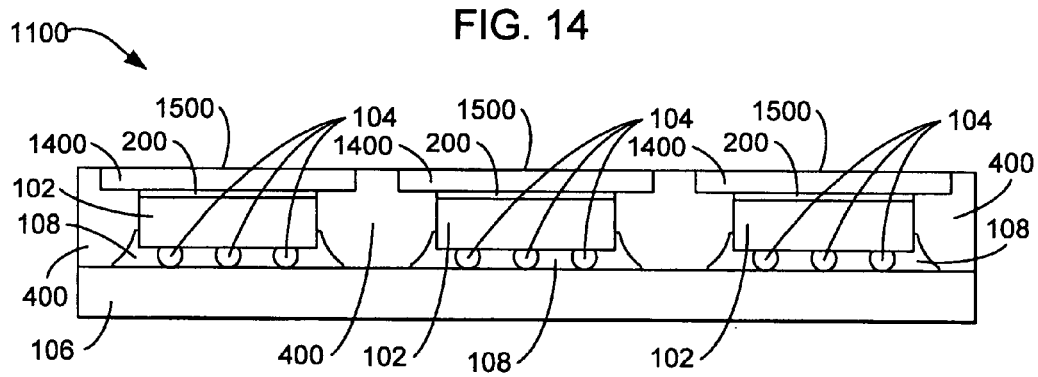
FIG. 15 is a cross-sectional view of the structure of FIG. 14 after application and molding of an encapsulant.

Referring now to FIG. 15, therein is shown a cross-sectional view of the structure of FIG. 14 following application and molding of an encapsulant 400 to encapsulate all of the volume around the chips 102 and up to the level of the top surfaces 1500 of the heat spreader panels 1400. As can be seen, encapsulating the semiconductor chip devices in this manner leaves the top surfaces 1500 of the flat panel heat spreaders, opposite the substrate 106, externally exposed.

As can also be seen, the positioning of the heat spreader panels 1400 above the chips 102 in this manner provides maximum space and volume underneath the heat spreader panels 1400, thereby accommodating a wide variety and number of chip and/or system component configurations. In addition, the encapsulant 400, by filling the entire space below the heat spreader panels 1400 and above the substrate 106, significantly stiffens the assembly to minimize warpage thereof.

Figure 16:
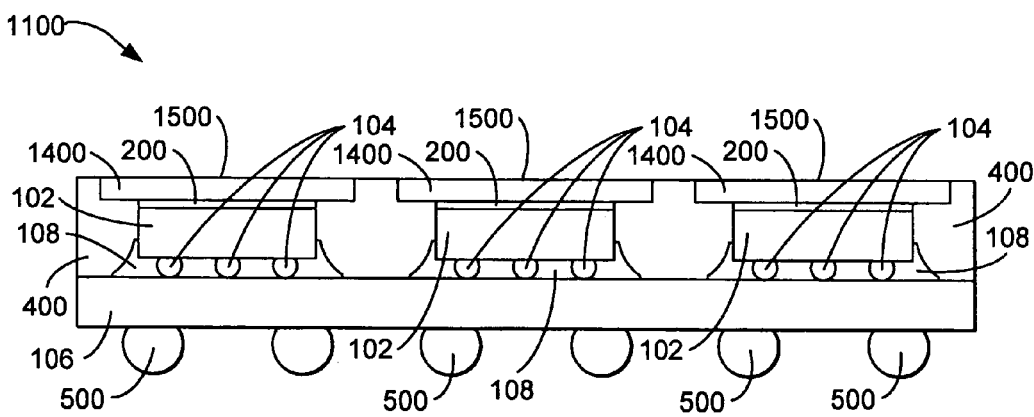
FIG. 16 is the structure of FIG. 15 following attachment of a ball grid array to the underside of the substrate.

Referring now to FIG. 16, therein is shown the structure of FIG. 15 following the optional attachment of a BGA 500 to the bottom or underside of the substrate 106 opposite the chips 102. The BGA provides for subsequent physical and electrical connection and assembly of the finished package onto a circuit card, a circuit board, or the like. The BGA 500 is connected electrically through the substrate 106 by traces (not shown) that connect to various circuit patterns on the substrate 106 and thence to the solder balls 104 on the chips 102.

Figure 17:
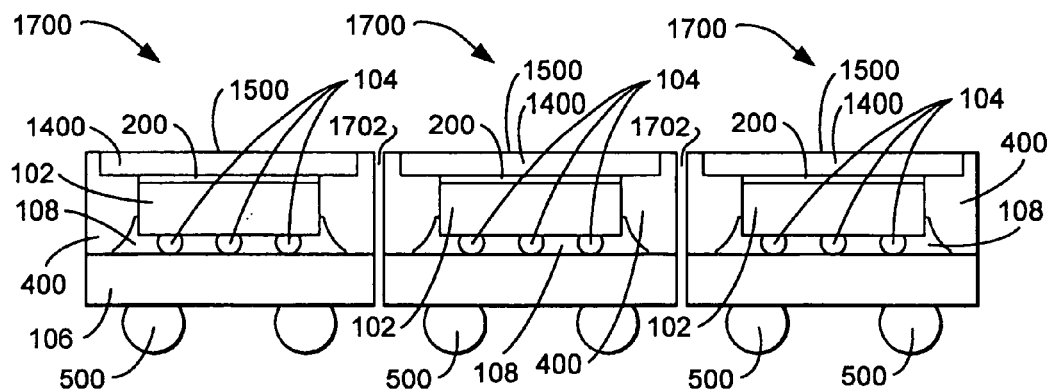
FIG. 17 is the structure of FIG. 16 after singulation of individual units in accordance with the present invention.

Referring now to FIG. 17, therein is shown the structure of FIG. 16 following singulation of individual semiconductor packages from the continuous strip format of the flip chip assembly 1100 (FIG. 16). The singulation has resulted in the separation of the flip chip assembly into individual FCIP and/or FC-SiP units 1700 at singulation zones 1702.

Figure 18:
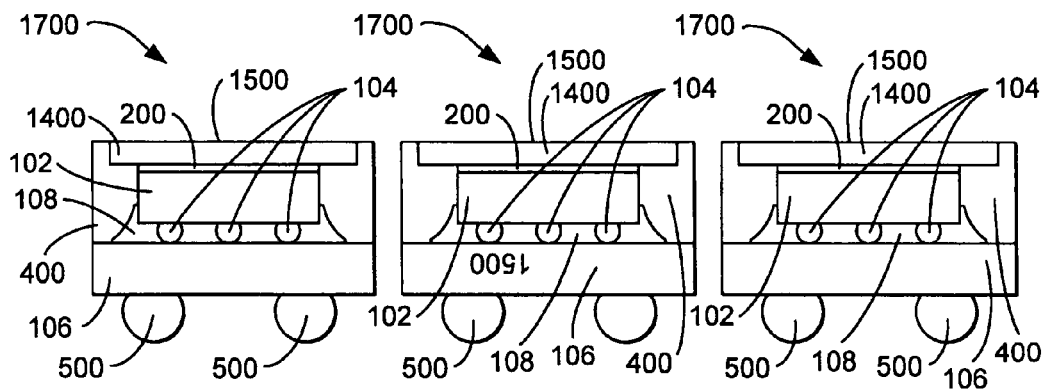
FIG. 18 is a cross-sectional view of three of the units of FIG. 17 in a final product configuration.

Referring now to FIG. 18, therein are shown three of the units 1700 in their final product configuration.

Figures 19, 20, 21:
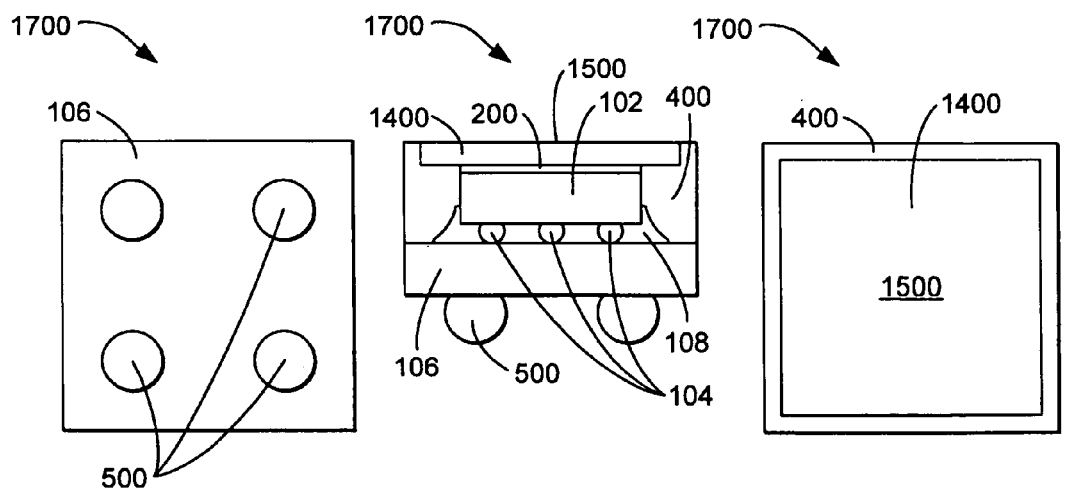
FIG. 19 is a bottom view of one of the units of FIG. 18.
FIG. 20 is a cross-sectional view of one of the units of FIG. 18.
FIG. 21 is a top view of one of the units of FIG. 18.

Referring now to FIG. 19, therein is shown a bottom view of one of the units 1700.

Referring now to FIG. 20, therein is shown a cross-sectional view of one of the units 1700.

Referring now to FIG. 21, therein is shown a top view of one of the units 1700.

Figure 22:
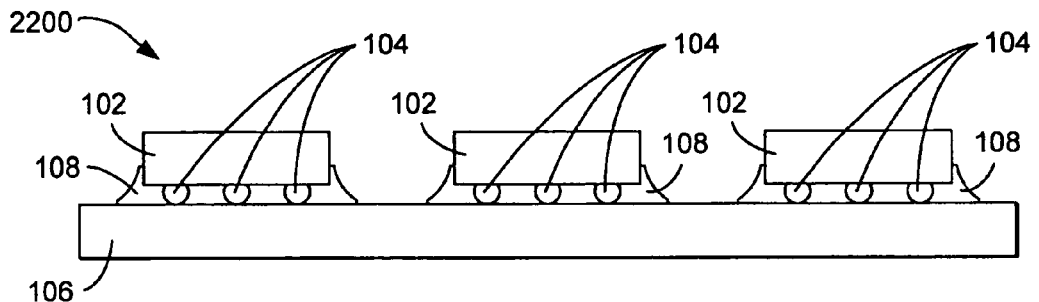
FIG. 22 is a view of an alternate embodiment of a portion of a flip chip assembly in an intermediate stage of manufacture.

Referring now to FIG. 22, therein is shown a portion of an alternate embodiment of a flip chip assembly 2200 at an intermediate stage of manufacture. The portion of the flip chip assembly 2200 shown in FIG. 22 is similarly part of a continuous strip format that is manufactured and assembled in a new, continuous, assembling, forming, molding, curing, and singulating process that provides packages having flat panel heat spreaders externally exposed over substantially an entire surface of each package.

Thus, semiconductor flip chip devices such as the chips 102, having solder balls 104, are secured and electrically connected to the top surface of a substrate 106 on solder pads (not shown) on the top surface of the substrate 106. The substrate 106 is provided and configured in a continuous strip format, and the chips 102 are attached in a continuous strip format to the substrate 106. An underfill 108 is applied between and fills the space between the chips 102 and the substrate 106.

As before, it will also be understood that other electronic components may also be assembled onto the substrate 106, such as when packages in system such as FC-SiPs are being fabricated. Accordingly, the chips 102, as shown and described, are illustrative and exemplary and also represent such other components and/or systems as appropriate.

Figure 23:
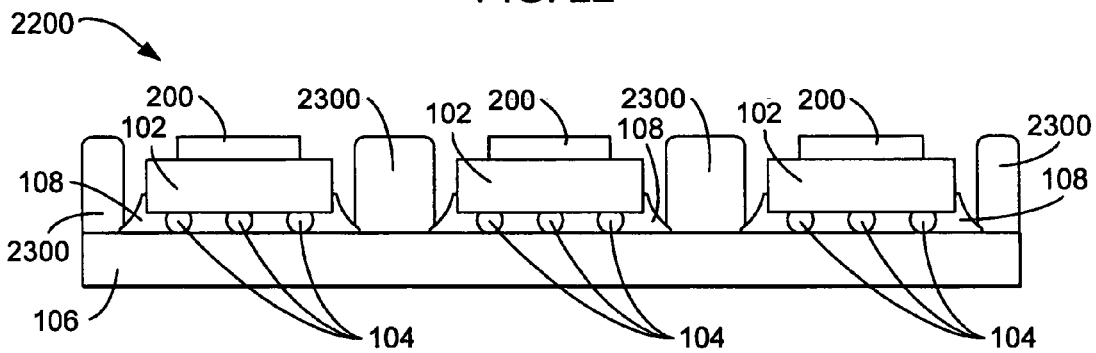
FIG. 23 is the structure of FIG. 22 following application of a thermal interface material and an encapsulant.

Referring now to FIG. 23, therein is shown the configuration of FIG. 22 following application of the TIM 200 to the chips 102 opposite the substrate 106, and dispensing and application of an encapsulant 2300 onto the top of the substrate 106 in the open spaces between the chips 102 and prior to attaching a flat panel heat spreader thereon.

Figure 24:
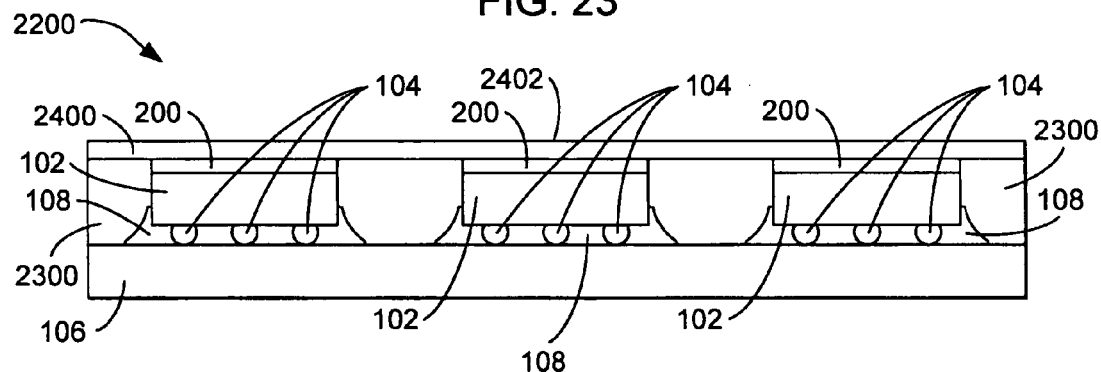
FIG. 24 is a cross-sectional view of the configuration of FIG. 23 following attachment of a continuous flat panel heat spreader.

Referring now to FIG. 24, therein is shown a cross-sectional view of the configuration of FIG. 23 following attachment of a continuous flat panel heat spreader 2400 onto the top thereof over the entire strip. The continuous flat panel heat spreader 2400 is secured onto the assembly by the TIM 200 and/or the encapsulant 2300, following the curing thereof. The volume of the encapsulant 2300 applied in the step illustrated in FIG. 23 is selected to completely fill the space above the substrate 106, below the continuous flat panel heat spreader 2400, and between the chips 102, similarly as in the other flip chip assemblies 100 (FIG. 4) and 1100 (FIG. 15). Encapsulating the semiconductor flip devices in this manner leaves the top surface 2402 of the continuous flat panel heat spreader 2400, opposite the substrate 106, externally exposed, as well as not requiring molding of the encapsulant 2300.

As can also be seen, the positioning of the continuous flat panel heat spreader 2400 above the chips 102 in this manner provides maximum space and volume underneath the heat spreader, thereby accommodating a wide variety and number of chip and/or system component configurations. In addition, the encapsulant 2300, by filling the entire space below the continuous flat panel heat spreader 2400 and above the substrate 106, significantly stiffens the assembly to minimize warpage thereof.

Figure 25:
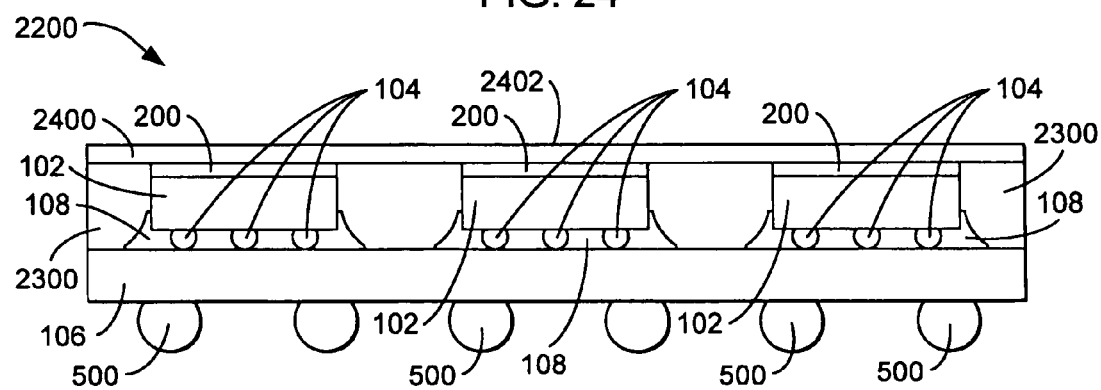
FIG. 25 is the structure of FIG. 24 after attachment of a ball grid array to the underside of the substrate.

Referring now to FIG. 25, therein is shown the structure of FIG. 24 following the optional attachment of a BGA 500 to the bottom or underside of the substrate 106 opposite the chips 102. The BGA provides for subsequent physical and electrical connection and assembly of the finished package onto a circuit card, a circuit board, or the like. The BGA 500 is connected electrically through the substrate 106 by traces (not shown) that connect to various circuit patterns on the substrate 106 and thence to the solder balls 104 on the chips 102.

Figure 26:
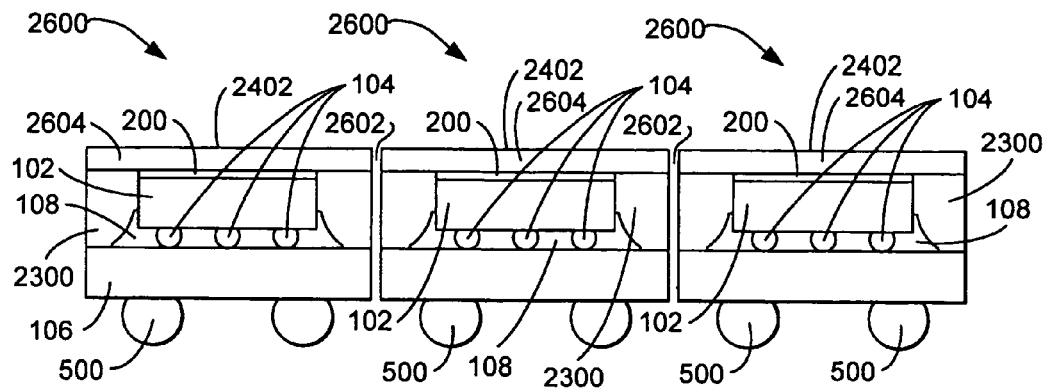
FIG. 26 is the structure of FIG. 25 after singulation of individual units in accordance with the continuous strip-manufacturing process of the present invention.

Referring now to FIG. 26, therein is shown the structure of FIG. 25 following singulation of individual semiconductor packages from the continuous strip format of the flip chip assembly 2200 (FIG. 25). The singulation has resulted in the separation of the flip chip assembly into individual FCIP and/or FC-SiP units 2600 at singulation zones 2602. It has also resulted in separation of the continuous flat panel heat spreader 2400 (FIG. 25) into individual heat spreader panels 2604.

Figure 27:
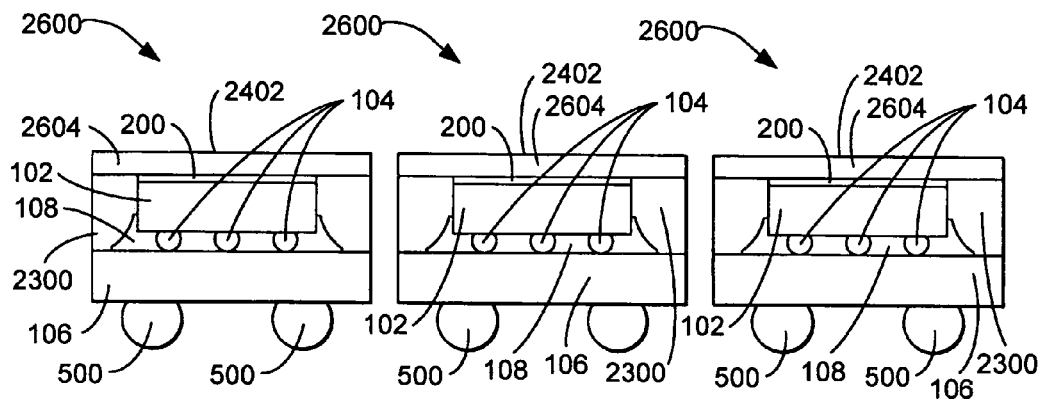
FIG. 27 is a cross-sectional view of three of the units of FIG. 26 in a final product configuration.

Referring now to FIG. 27, therein are shown three of the units 2600 in their final product configuration.

Figures 28, 29, 30:
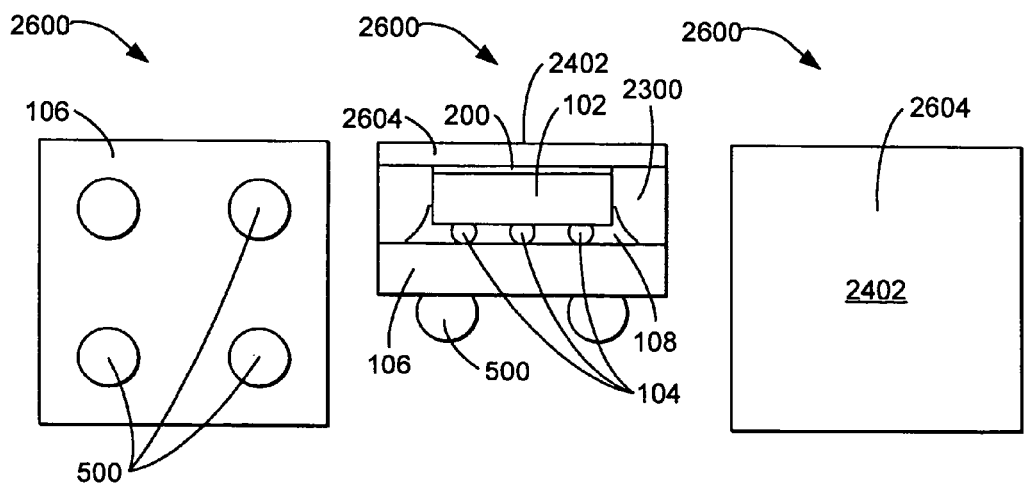
FIG. 28 is a bottom view of one of the units of FIG. 27.
FIG. 29 is a cross-sectional view of one of the units of FIG. 27.
FIG. 30 is a top view of one of the units of FIG. 27.

Referring now to FIG. 28, therein is shown a bottom view of one of the units 2600.

Referring now to FIG. 29, therein is shown a cross-sectional view of one of the units 2600.

Referring now to FIG. 30, therein is shown a top view of one of the units 2600.

In view of the processes just described, it will be understood that the packages manufactured according to the present invention will have readily identifiable indicia resulting from fabrication according to these processes. One of the indicia will be characteristics on the external surfaces of the heat spreaders and the heat spreader panels disclosing that the external surfaces thereof were open and exposed (i.e., not protectively coated) during at least the strip encapsulation of the packages. Such characteristics would include, for example, the kind, quantity, and extent of residue from the encapsulation and other manufacturing processes. Such characteristics will thereby constitute indicia that are characteristic of such strip open encapsulation.

Another of the indicia will be markings and characteristics on the package surfaces characteristic of packages that were singulated by strip singulation rather than block-molded singulation. For the package units 2600 (FIG. 26), still another of the indicia will be factors that are characteristic of individual heat spreader panels 2604 that were singulated following the encapsulation of the lower surface of the continuous flat panel heat spreader 2400 (FIG. 25).

Figure 31:
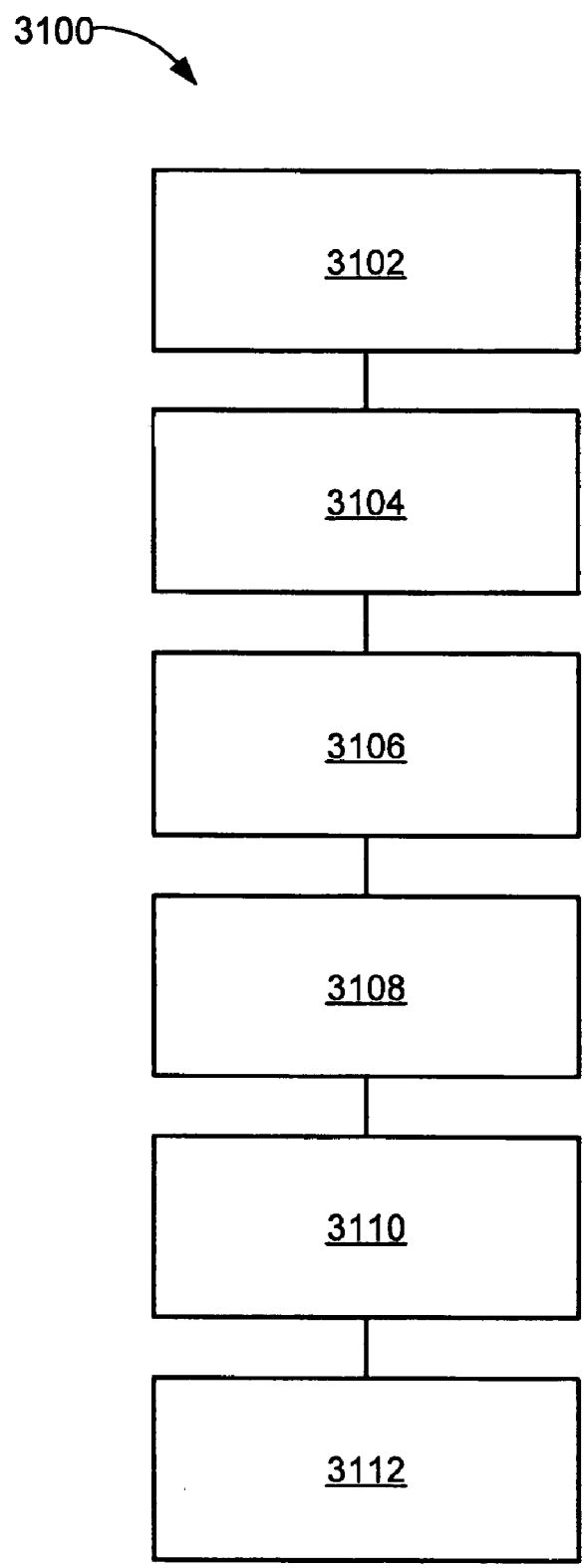
FIG. 31 is a flow chart of a method for manufacturing strip-fabricated flip chip in package and flip chip in system heat spreader assemblies in accordance with the present invention.

Referring now to FIG. 31, therein is shown a flow chart of a method 3100 for fabricating a semiconductor package in accordance with the present invention. The method 3100 includes providing a substrate in a strip format in a block 3102; attaching semiconductor devices in a strip format to the substrate in a block 3104; applying a thermal interface material to the semiconductor devices in a block 3106; attaching a flat panel heat spreader to each semiconductor device in a block 3108; encapsulating the semiconductor devices while leaving the surface of the flat panel heat spreader opposite the substrate externally exposed in a block 3110; and singulating individual semiconductor packages from the strip format in a block 3112.

It has been discovered that the present invention thus provides numerous advantages. Principal among these is the heretofore unknown, straightforward, low cost design and assembly process that provides for the manufacture of FCIP and FC-SiP units in continuous strip formats.

Another advantage is that the flat panel heat spreader is located opposite the substrate, allowing maximum space underneath the heat spreader to accommodate various components, particularly in FC-SiP configurations.

Still another advantage is that the encapsulant fills the entire space below the heat spreader for improved package stiffness and warpage minimization.

Yet another advantage is that the flat heat spreaders, in the strip-manufacturing configurations, are assembled into the packages with the outer surface of the heat spreaders always exposed. This contributes to the simplicity and economy of the manufacturing process, as well as maximizing the external exposed contact area of the heat spreaders for next-level heat dissipation.

Thus, it has been discovered that the strip-fabricated heat spreader assemblies and the fabrication methods therefor, as taught herein, furnish important and heretofore unavailable solutions, capabilities, and functional advantages. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating a semiconductor package, comprising:
   providing a substrate in a strip format;
   attaching semiconductor devices in a strip to the substrate;
   applying and underfill between the semiconductor devices an substrate;
   applying a thin thermal interface material to the semiconductor devices;
   attaching a flat panel heat spreader to the thermal interface material on each semiconductor device;
   encapsulating substantially all of the volume between the heat spreader and the substrate, except that occupied by the semiconductor devices and other electronic devices assembled on the substrate, with open encapsulation, leaving the surface of the flat panel heat spreader opposite the substrate externally exposed; and
   singulating individual semiconductor packages from the strip format.

2. The method of claim 1 wherein the heat spreader is a pre-cut flat panel configuration.

3. The method of claim 1 wherein the heat spreader is a continuous flat panel heat spreader attached over substantially the entire strip format.

4. The method of claim 3 further comprising cutting the continuous flat panel heat spreader into individual heat spreader panels following attaching the flat panel heat spreader.

5. The method of claim 3 further comprising dispensing an encapsulant for encapsulating the semiconductor devices and for attaching the flat panel heat spreader prior to attaching the flat panel heat spreader.

6. A method for fabricating a semiconductor package, comprising:
   providing a substrate in a continuous strip format;
   attaching semiconductor devices in a continuous strip format to the substrate;
   applying an underfill between the semiconductor devices and the substrate;
   applying a thin thermal interface material to the upper faces of the semiconductor devices opposite the substrate;
   attaching a flat panel heat spreader to each semiconductor device by means of the thermal interface material;
   curing the thermal interface material;
   encapsulating substantially all of the volume between the heat spreader and the substrate, except that occupied by the semiconductor devices and other electronic devices assembled on the substrate, with open encapsulation, leaving the surface of the flat panel heat spreader opposite the substrate externally exposed;
   attaching ball grid arrays to the substrate opposite the semiconductor devices; and
   singulating individual semiconductor packages from the continuous strip format.

7. The method of claim 6 wherein the heat spreader is a pre-cut flat panel configuration.

8. The method of claim 6 wherein the heat spreader is a continuous flat panel heat spreader attached over substantially the entire continuous strip format.

9. The method of claim 8 further comprising cutting the continuous flat panel heat spreader into individual heat spreader panels following the steps of attaching the flat panel heat spreader and curing the thermal interface material.

10. The method of claim 8 further comprising dispensing an encapsulant for encapsulating the semiconductor devices and for attaching the flat panel heat spreader prior to attaching the flat panel heat spreader.

11. Semiconductor packages in a strip format, comprising:
   a substrate in a strip format;
   semiconductor devices attached in a strip format to the substrate;
   an underfill between the semiconductor devices and the substrate;
   a thin thermal interface material applied to the semiconductor devices;
   a flat panel heat spreader attached thermal interface material on to each semiconductor device;
   substantially all of the volume between the heat spreader and the substrate, except that occupied by the semiconductor devices and other electronic devices assembled on the substrate, being encapsulated with the surface of the flat panel heat spreader opposite the substrate being externally exposed; and
   the packages having indicia characteristic of strip open encapsulation.

12. The semiconductor packages of claim 11 wherein the flat panel heat spreader is a pre-cut flat panel configuration.

13. The semiconductor packages of claim 11 wherein the flat panel heat spreader is an individual heat spreader panel cut from a continuous flat panel heat spreader.

14. The semiconductor packages of claim 11 wherein the flat panel heat spreader is a continuous flat panel heat spreader attached over substantially the entire strip format.

15. The semiconductor packages of claim 11 further comprising individual semiconductor packages singulated from the strip format and having indicia characteristic of strip singulation.

16. Semiconductor packages in a continuous strip format, comprising:
   a substrate in a continuous strip format;
   semiconductor devices attached in a continuous strip format to the substrate;
   an underfill between the semiconductor devices and the substrate;
   a thin thermal interface material applied to the upper faces of the semiconductor devices opposite the substrate;
   a flat panel heat spreader attached to each semiconductor device by means of the thermal interface material;

substantially all of the volume between the heat spreader and the substrate, except that occupied by the semiconductor devices and other electronic devices assembled on the substrate, being encapsulated with the surface of the flat panel heat spreader opposite the substrate being externally exposed;

ball grid arrays attached to the substrate opposite the semiconductor devices; and the packages having indicia characteristic of strip open encapsulation.

17. The semiconductor packages of claim 16 wherein the flat panel heat spreader is a pre-cut flat panel configuration.

18. The semiconductor packages of claim 16 wherein the flat panel heat spreader is individual heat spreader panels cut from a continuous flat panel heat spreader.

19. The semiconductor packages of claim 16 wherein the flat panel heat spreader is a continuous flat panel heat spreader attached over substantially the entire strip format.

20. The semiconductor packages of claim 16 further comprising individual semiconductor packages singulated from the strip format and having indicia characteristic of strip singulation.

* * * * *

UNITED STATES PATENT AND TRADEMARK OFFICE
CERTIFICATE OF CORRECTION

| | | |
|---|---|---|
| PATENT NO. | : 7,153,725 B2 | Page 1 of 1 |
| APPLICATION NO. | : 10/766746 | |
| DATED | : December 26, 2006 | |
| INVENTOR(S) | : Wang et al. | |

It is certified that error appears in the above-identified patent and that said Letters Patent is hereby corrected as shown below:

<u>Column 6</u>

Line 12, delete "FIG. 1" and insert therefor --FIG. 11--

<u>Column 9</u>

Claim 1, line 26, delete "strip" and insert therefor --strip format--

Claim 1, line 27, delete "and underfill" and insert therefor --an underfill--

Claim 1, line 28, delete "an" and insert therefor --and the--

<u>Column 10</u>

Claim 11, line 34, insert --to the-- between "attached" and "thermal"

Claim 11, line 35, delete "to" between "on" and "each"

Signed and Sealed this

Thirteenth Day of February, 2007

JON W. DUDAS
*Director of the United States Patent and Trademark Office*